(12) United States Patent
Liao et al.

(10) Patent No.: US 8,111,178 B2
(45) Date of Patent: Feb. 7, 2012

(54) CALIBRATION METHOD AND RELATED CALIBRATION APPARATUS FOR CAPACITOR ARRAY

(75) Inventors: Chieh-Wei Liao, Taipei County (TW); Chia-Hua Chou, Taipei County (TW); Tse-Hsiang Hsu, Hsin-Chu (TW); Wen-Hua Chang, Tainan County (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/626,629

(22) Filed: Nov. 26, 2009

(65) Prior Publication Data

US 2011/0122006 A1 May 26, 2011

(51) Int. Cl.
*H03M 1/10* (2006.01)
(52) U.S. Cl. ......... 341/120; 341/144; 341/155; 341/172
(58) Field of Classification Search .......... 341/117–120, 341/155, 156, 172, 144
See application file for complete search history.

(56) References Cited

U.S. PATENT DOCUMENTS

| 4,970,514 A | * | 11/1990 | Draxelmayr | 341/120 |
| 4,999,633 A | * | 3/1991 | Draxelmayr | 341/120 |
| 7,170,439 B1 | * | 1/2007 | Chen | 341/172 |

OTHER PUBLICATIONS

Seung-Hoon Lee and Bang-Sup Song, "Digital-Domain Calibration of Multistep Analog-to-Digital Converters", p. 1679-1688, IEEE Journal of Solid-State Circuits, vol. 27, No. 12, Dec. 1992.

* cited by examiner

*Primary Examiner* — Jean Jeanglaude
(74) *Attorney, Agent, or Firm* — Winston Hsu; Scott Margo

(57) ABSTRACT

A capacitor array includes a plurality of capacitor components each having a first node and a second node, and first nodes of the capacitor components are coupled to each other. A calibration method for the capacitor array utilizes a calibration capacitor component to couple the first nodes. Then, the calibration method determines a capacitance indication value regarding the specific capacitor component by coupling different references voltage to a second node of the specific capacitor component and coupling different test voltages to a second node of the calibration capacitor component. Accordingly, the calibration method calibrates the capacitance mismatches of the capacitor array in the digital domain.

17 Claims, 12 Drawing Sheets

Third Phase

Third Phase

CALIBRATION METHOD AND RELATED CALIBRATION APPARATUS FOR CAPACITOR ARRAY

BACKGROUND

The invention relates to a calibration method and related calibration apparatus for correcting errors generated in data converter system, and more particularly, to a method and apparatus for digitally correcting code errors due to capacitance mismatch of a capacitor array in data converter system.

In integrated circuit technology, as capacitors are fabricated more easily than resistors, capacitors are usually used as the precise components in an analog-to-digital converter (ADC) or a digital-to-analog converter (DAC), which is referred to as charge-redistribution technology. Usually, the linearity of the overall ADC or DAC is limited by the linearity of the capacitors. Therefore, an ADC or DAC with high resolution will often require some form of trimming or calibration to achieve the necessary linearity. This is due to inherent component-matching limitations. The accuracy of the A/D or D/A conversion utilizing charge-redistribution is mainly determined by the matching of the capacitors in the capacitor array. To achieve high resolution and accuracy, a certain calibration for the capacitor array is necessary.

A conventional self-calibration technique for a capacitor array is illustrated in FIG. 1. As can be seen from FIG. 1, a charge-compensation calibration capacitor $C_{cc}$ and a calibration digital-to-analog converter (DAC) 101 are utilized for calibrating a capacitor array 120 through a comparator 130 and a control circuit 140. This scheme mainly uses the charge-compensation calibration capacitor $C_{cc}$ for compensating mismatches among the capacitor array 120 during the normal operation of the capacitor array 120. For example, the charge-compensation calibration capacitor $C_{cc}$ draws charge from or injects charge to the capacitor array 120 while the ADC is performing A/D conversion. This process needs additional calibration cycle. As a result, the calibration operation significantly affects the sampling rate of the ADC, and the conversion speed is sacrificed. Obviously, these are disadvantages of the conventional capacitor calibration technique for a capacitor array that need to be solved.

SUMMARY

With this in mind, it is one of the objectives of the present invention to provide a calibration method and related apparatus for a capacitor array without affecting the normal operation of the capacitor array or an application (e.g., an analog-to-digital converter) using the capacitor array. More specifically, the present invention digitally calibrates the mismatch between the capacitor array, thereby improving the linearity of the capacitor array with high sampling rate, high operation speed, low cost and low power consumption.

In one embodiment, the calibration operation of the present invention calculates calibration information in digital representation prior to the normal operation of the capacitor array, so the capacitor calibration can be performed after the normal operation in hardware domain or software domain, thereby increasing the implementation flexibility. In addition, the calibration apparatus of the present invention can share a portion of circuits with the application using the capacitor array. For example, the calibration information is calculated using the capacitor array or part of the capacitor array.

According to one exemplary embodiment of the present invention, a calibration method for a capacitor array is provided. The capacitor array includes a plurality of capacitor components each having a first node and a second node, where first nodes of the capacitor components are coupled to each other. The calibration method includes: coupling a first node of a calibration capacitor component to the first nodes of the capacitor components; coupling a first reference voltage to a second node of a specific capacitor component under test selected from the plurality of capacitor components, and coupling a first test voltage to a second node of the calibration capacitor component to make a voltage level at the first nodes of the capacitor components fall within a range associated with a predetermined voltage; coupling a second reference voltage different from the first reference voltage to the second node of the specific capacitor component under test, and coupling a second test voltage to the second node of the calibration capacitor component to make the voltage level at the first nodes of the capacitor components fall within a range associated with the predetermined voltage; and determining a capacitance indication value corresponding to the specific capacitor component under test according to the first test voltage and the second test voltage, wherein the capacitance indication value indicates an error (e.g. mismatch) of the specific capacitor component under test.

According to one exemplary embodiment of the present invention, a calibration apparatus for a capacitor array is provided. The capacitor array includes a plurality of capacitor components each having a first node and a second node, and a switch circuit, where first nodes of the capacitor components are coupled to each other, and the switch circuit is coupled between the second nodes of the capacitor components and a plurality of different predetermined voltages. The calibration apparatus includes a calibration capacitor component and a calibration circuit. The calibration capacitor component has a first node coupled to the first nodes of the capacitor components of the capacitor array and a second node. The calibration circuit is coupled to the second node of the calibration capacitor component, the switch circuit, and the first nodes of the capacitor components, and configured for: controlling the switch circuit to couple a first reference voltage to a second node of a specific capacitor component under test selected from the plurality of capacitor components, and couple a first test voltage to the second node of the calibration capacitor component to make a voltage level at the first nodes of the capacitor components fall within a range associated with a predetermined voltage; controlling the switch circuit to couple a second reference voltage different from the first reference voltage to the second node of the specific capacitor component under test, and couple a second test voltage to the second node of the calibration capacitor component to make the voltage level at the first nodes of the capacitor components fall within a range associated with the predetermined voltage; and determining a capacitance indication value corresponding to the specific capacitor component under test according to the first test voltage and the second test voltage, wherein the capacitance indication value indicates an error (e.g. mismatch) of the specific capacitor component under test.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . ." The terms "couple" and "coupled" are intended to mean either an indirect or a direct electrical connection. Thus, if a first device couples to a second device, that connection may be through a direct electrical connection, or through an indirect electrical connection via other devices and connections.

According to an embodiment of the present invention, a first step of capacitor calibration is to determine capacitance indication values indicating capacitance mismatches among each capacitor component of a capacitor array. Accordingly, after the capacitance indication values are determined, digital values (e.g., digital codes) generated by an apparatus (e.g., an ADC) utilizing the capacitor array are corrected based on the capacitance indication values. Thus, the exemplary calibration operation of the present invention comprises two sub-operations: one is a mismatch determination operation while the other is a code correction operation. In most conditions, the number of times the mismatch determination operation is performed depends on the total number of capacitor components in the capacitor array, and the code correction operation is performed once digital outputs are generated by the apparatus, such as an ADC, which utilizes the capacitor array.

According to one exemplary embodiment of the present invention, the mismatch determination operation can be divided into three phases. The first phase of the mismatch determination operation is to eliminate the influence of the offset voltage and low frequency noises existing in a comparator. As will be readily appreciated by one skilled in the art, the offset voltage and low frequency noises could be caused by a variety of reasons, which are not explained here for brevity. The second and third phases of the calibration operation are to determine the capacitance mismatches among the capacitor components of the capacitor array by changing voltages coupled to the capacitor components of the capacitor array. Further details are described as follows.

Figure 1:
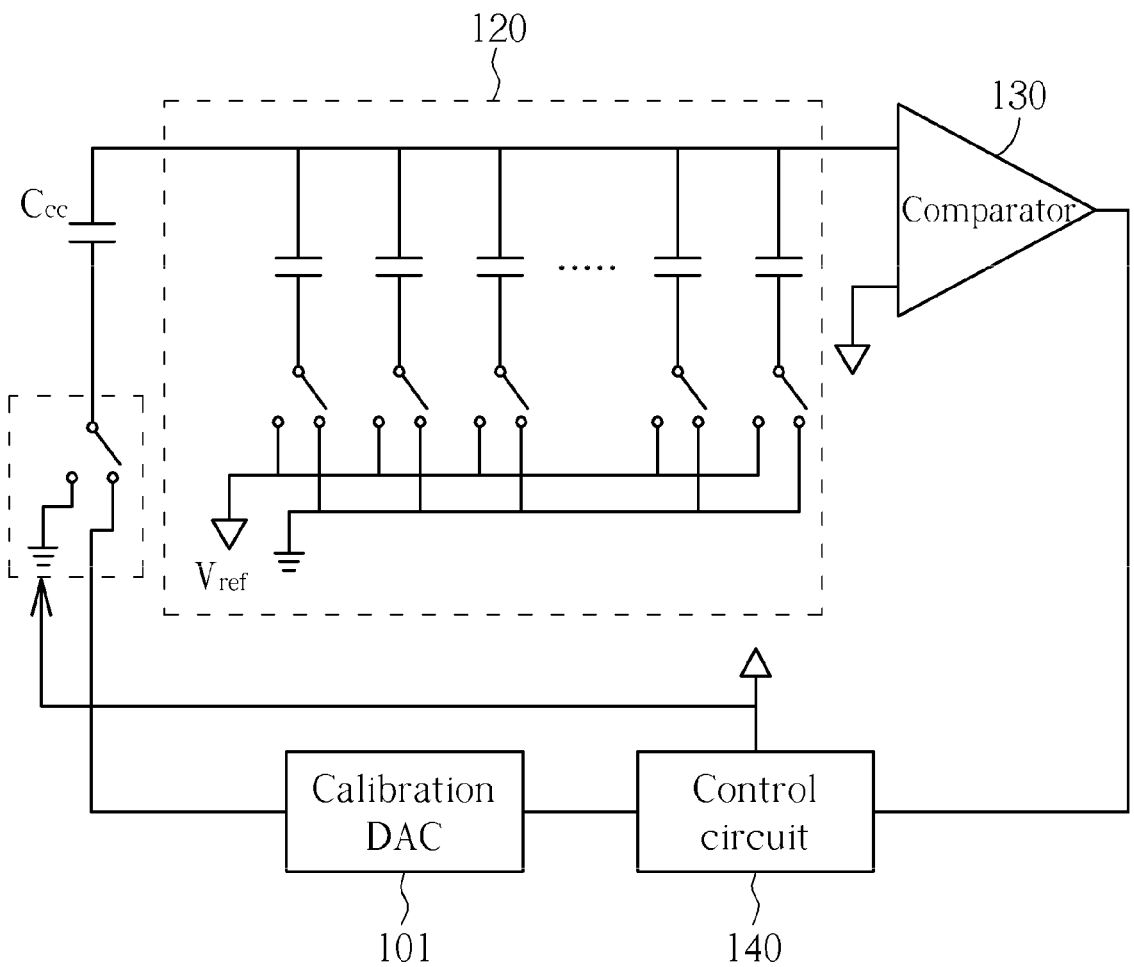
FIG. 1 is a diagram showing a circuit corresponding to a conventional calibration circuit and capacitor array.
Figure 2:
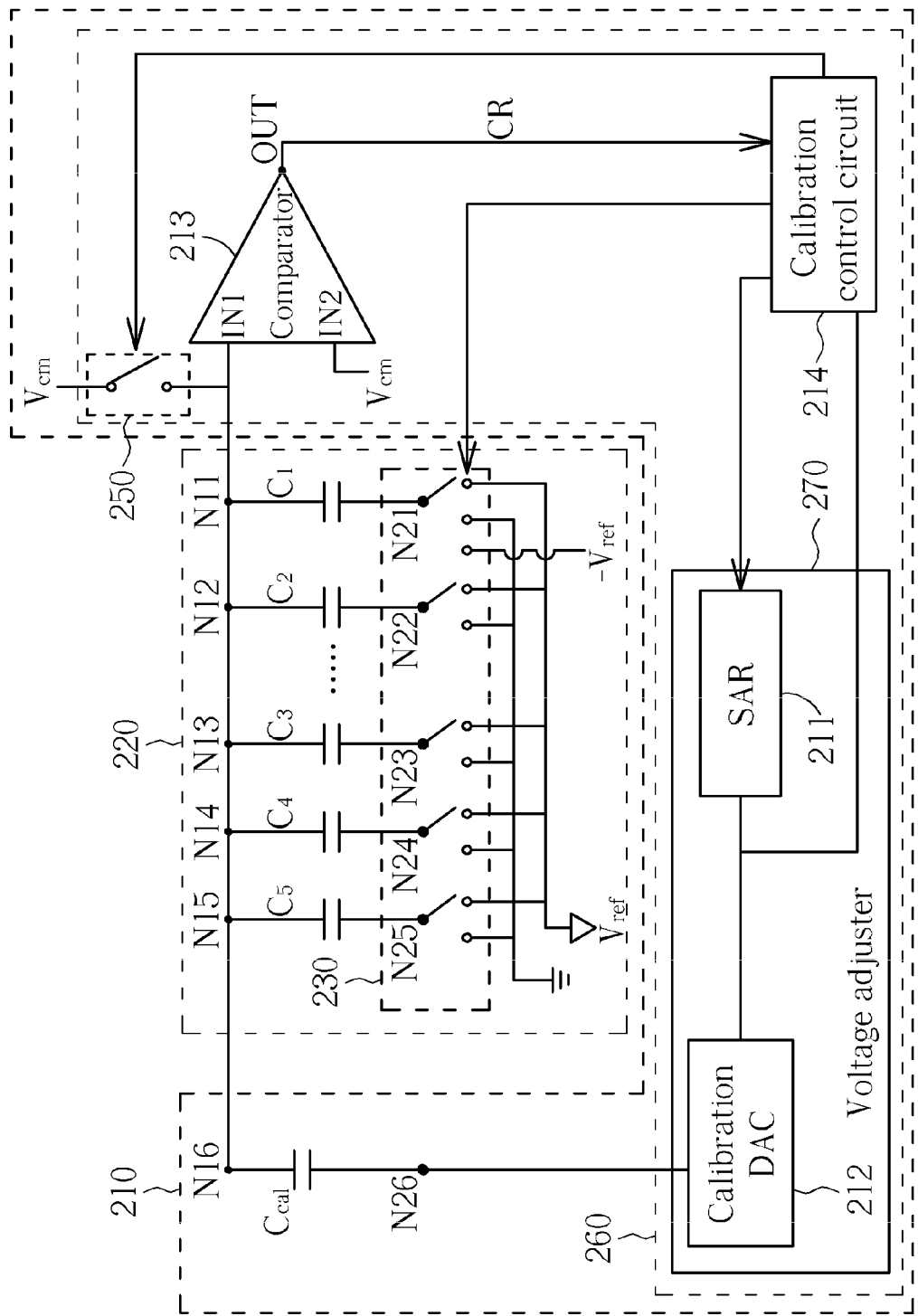
FIG. 2 is a diagram showing circuitry of a calibration apparatus and a capacitor array according to one exemplary embodiment of the present invention.

Please refer to FIG. 2, which is a diagram showing a calibration apparatus for calibrating a capacitor array according to one exemplary embodiment of the present invention. As can be seen from FIG. 2, a calibration apparatus 210 is utilized for calibrating a capacitor array 220 having, for example, five capacitor components $C_1$, $C_2$, $C_3$, $C_4$ and $C_5$, and a switch circuit 230 composed of a plurality of switch units respectively coupled to the capacitor components $C_1$-$C_5$, where each of the capacitor components $C_1$-$C_5$ has a first node N11, N12, N13, N14, N15 and a second node N21, N22, N23, N24, N25, and the first nodes N11-N15 of the capacitor components $C_1$-$C_5$ are connected to each other. It should be noted that the number of capacitor components implemented in the capacitor array 220 shown in FIG. 2 is for illustrative purposes only. In other words, in other embodiments of the present invention, the calibration apparatus of the present invention can be applied to a capacitor array having more or fewer capacitors. Also, there is no limitation to the weighted type or the capacitance value, which means that the weighted type or the capacitance value of the capacitor array could be a binary weighted type, a thermometer weighted type, or a mixed type.

The calibration apparatus 210 includes, but is not limited to, a calibration capacitor component $C_{cal}$, and a calibration circuit 260, where the calibration circuit 260 includes a switch unit 250, a voltage adjuster 270 having a successive approximation register (SAR) 211 and a calibration digital-to-analog converter (DAC) 212, a comparator 213 and a calibration control circuit 214. The calibration capacitor component $C_{cal}$ has a first node N16 coupled to first nodes N11-N15 of the capacitor components $C_1$-$C_5$, and a second node N26 coupled to the calibration DAC 212 for receiving a test voltage supplied by the voltage adjuster 270. In fact, in this embodiment, the capacitor array 220, the comparator 213 and the SAR 211 are components of an SAR analog-to-digital converter (ADC). In other words, the calibration apparatus 210 shares part of the circuits with the SAR ADC, thereby having an advantage of decreasing the hardware cost. However, this is just a preferred exemplary embodiment of the present invention, and is not meant to be a limitation to the scope of the present invention. For example, the calibration apparatus of the present invention can be applied to any other type of ADC or digital circuit requiring a capacitor array implemented therein, such as a flash ADC or a charge-redistribution digital-to-analog converter (DAC). Furthermore, in other embodiments, the calibration apparatus may not share the circuit components with the digital circuit where the capacitor array is disposed. These alternative designs also fall within the scope of the present invention.

The calibration control circuit 214 is utilized for controlling operations of the switch circuit 230 in the capacitor array 220 and the switch unit 250. Specifically, the calibration control circuit 214 controls voltages coupled to the capacitor components $C_1$-$C_5$ in the capacitor array 220 and a first input terminal IN1 of the comparator 213. Also, the calibration control circuit 214 is used to store information (e.g., capacitance indication values hereinafter) about the capacitance mismatches that is generated in mismatch determination operations, and uses the stored information to perform code correction operations. Furthermore, the calibration control circuit 214 controls the phase switching during the mismatch determination operation.

The comparator 213 is implemented for comparing the voltage level at the first input terminal IN1 (i.e., the voltage level at the first nodes of the capacitor components $C_1$-$C_5$) with a predetermined voltage (e.g., $V_{cm}$ shown in FIG. 2) supplied to a second input terminal IN2 to generate a comparison result CR at an output terminal OUT. The voltage adjuster 270 is coupled between the output terminal OUT of the comparator 213 and the second node N26 of the calibration capacitor component $C_{cal}$, and implemented for tuning a test voltage supplied to the second node N26 of the calibration capacitor component $C_{cal}$ according to the comparison result CR until the voltage level at the first input terminal IN1 falls within a range associated with the predetermined voltage (e.g., $V_{cm}$). For example, a desired test voltage supplied to the calibration capacitor component $C_{cal}$ is finally obtained when the comparison result CR indicates that the voltage level at the first input terminal IN1 is substantially equal to the predetermined voltage (e.g., $V_{cm}$).

Figure 3A:
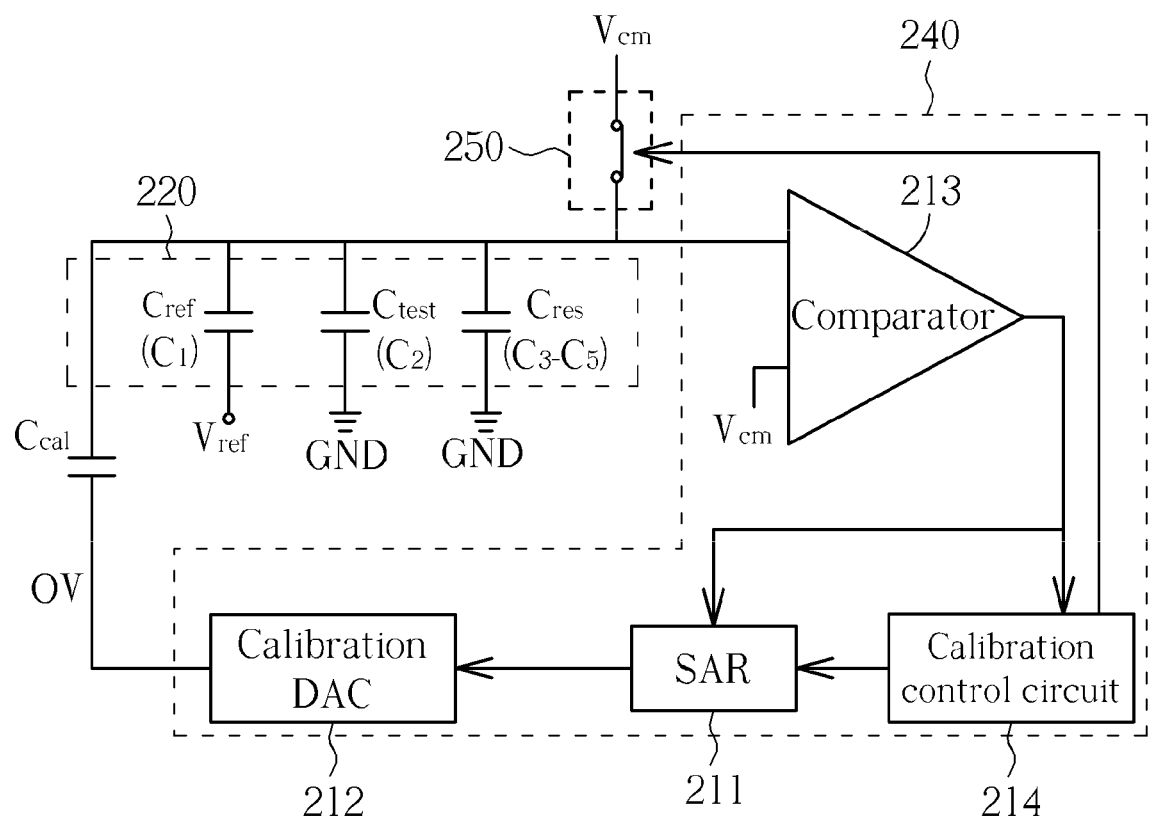
FIG. 3A-3C are simplified diagrams respectively showing a first, second and third phases of a calibration operation according to one exemplary embodiment of the present invention.
Figure 3B:
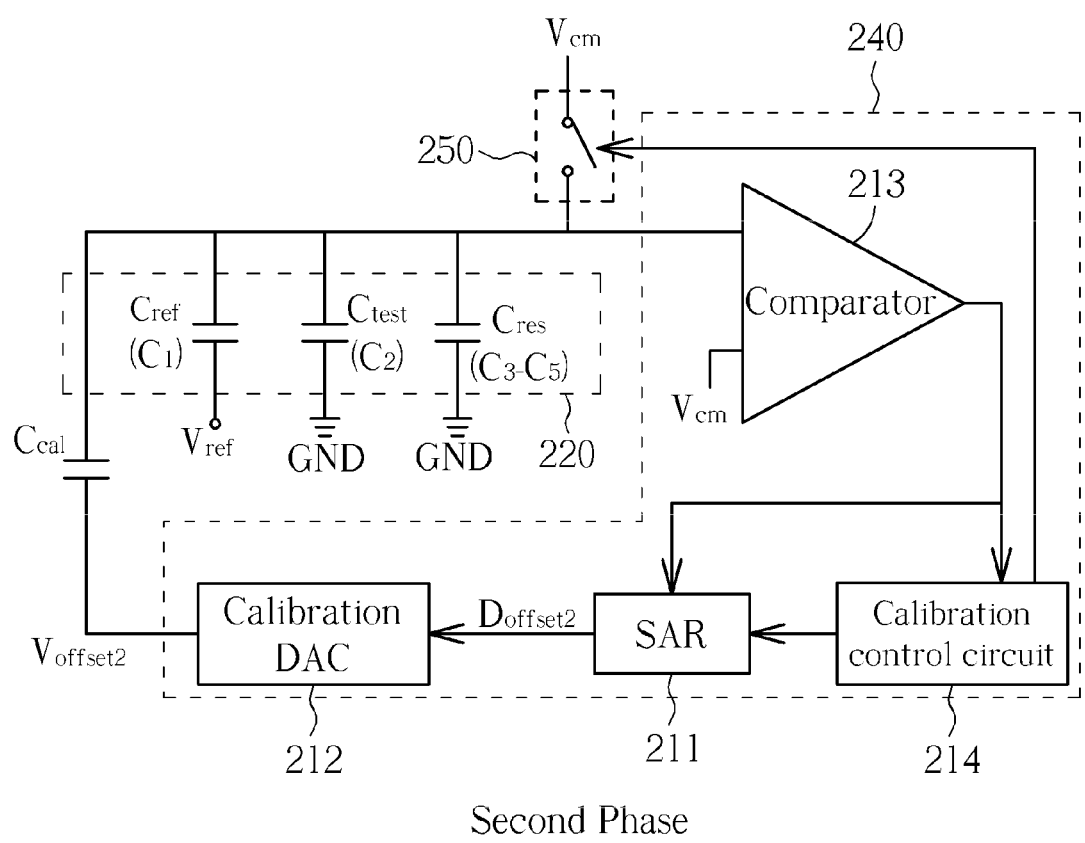
Figure 3C:
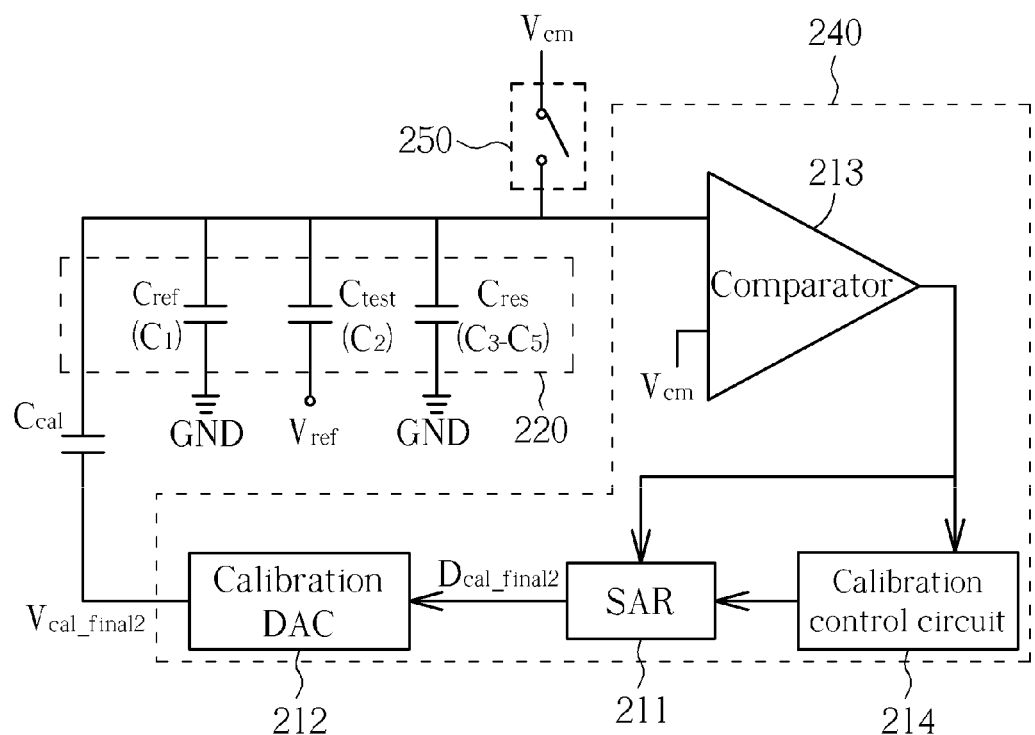

Please refer to FIGS. 3A, 3B and 3C in conjunction with FIG. 2. FIGS. 3A, 3B and 3C are simplified diagrams showing a specific mismatch determination operation according to one exemplary embodiment of the present invention. It should be noted that the entire calibration method involves several mismatch determination operations for different capacitor components of the capacitor array, respectively, and FIGS. 3A, 3B and 3C shows only one for clarity and simplicity. In other words, one mismatch determination operation is utilized for determining the capacitance mismatch of only one capacitor component of the capacitor array. In addition, FIGS. 3A, 3B and 3C simplify the capacitor array 220 for illustration clarity, wherein the capacitor component $C_{test}$ represents a capacitor component under test selected from the capacitor components $C_1$-$C_5$ whose mismatched capacitance value is to be determined in the current mismatch determination operation, the capacitor component $C_{ref}$ represents capacitor component(s) utilized as a criterion (or calibration base) to determine the capacitance value of the capacitor component under test $C_{test}$, and the capacitor component $C_{res}$ represents the remaining capacitor component(s) of the capacitor array.

In most cases, the mismatch determination operation utilizes previous tested capacitor component(s) as the capacitor component $C_{ref}$; in other words, the capacitor component $C_{ref}$ is an equivalent capacitor component of one or more capacitor components which have been processed by previous mismatch determination operation(s). More specifically, the capacitor component $C_{test}$ in the current mismatch determination operation may become one of the capacitor components represented by the capacitor component $C_{ref}$ in the next mismatch determination operation. In one preferred implementation, the capacitor component $C_{test}$ which has been tested in the current mismatch determination operation is allowed to be incorporated into the next capacitor component $C_{ref}$ when a capacitor component $C_{test}$ selected to be tested in the next mismatch determination operation has a capacitance value not smaller than a total capacitance value of the capacitor component $C_{ref}$; that is, the total capacitance value of tested capacitor component(s) (i.e., $C_{ref}$) is not greater than a capacitance value of a capacitor component currently selected to be tested (i.e., $C_{test}$). In this way, the charge redistribution between the capacitor component $C_{test}$ and capacitor component $C_{ref}$ would be normal and correct For example, provided that the capacitor array 220 is binary-weighted from the capacitor component $C_1$ to the capacitor component $C_5$ (e.g., $C_1:C_2:C_3:C_4:C_5=1:2:4:8:16$), if the capacitor component $C_3$ is the capacitor component under test $C_{test}$ in a current mismatch determination operation, the capacitor component $C_3$ may become part of the capacitor component $C_{ref}$ in a next mismatch determination operation. However, in the case where the mismatch determination operation is executed for the first time, as no capacitor component in the capacitor array has been tested yet, there is only a capacitor component $C_{test}$ and a capacitor component $C_{res}$; for example, the capacitor component $C_{test}$ is the capacitor component $C_1$ with a smallest capacitance value, and the capacitor component $C_{res}$ is equivalent to a parallel connection of remaining capacitor components $C_2$-$C_5$. Similarly, in another case where the mismatch determination operation is executed for the last time, as no capacitor component remains un-tested in the capacitor array, there is only a capacitor component $C_{test}$ (for example, the capacitor component $C_{test}$ is the capacitor component $C_5$ with a largest capacitance value) and a capacitor component $C_{ref}$ (for example, the capacitor component $C_{res}$ is equivalent to a parallel connection of the tested capacitor components $C_1$-$C_4$).

Figure 4A:
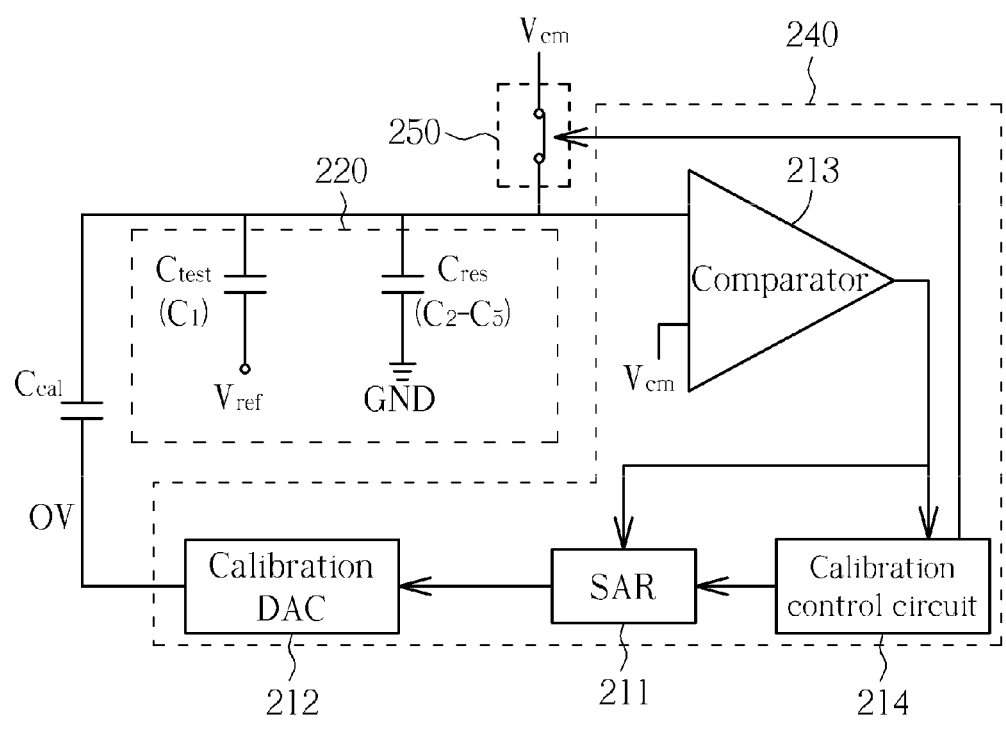
FIG. 4A-4C are simplified diagrams respectively showing a first, second and third phases of a calibration operation according to another exemplary embodiment of the present invention.
Figure 4B:
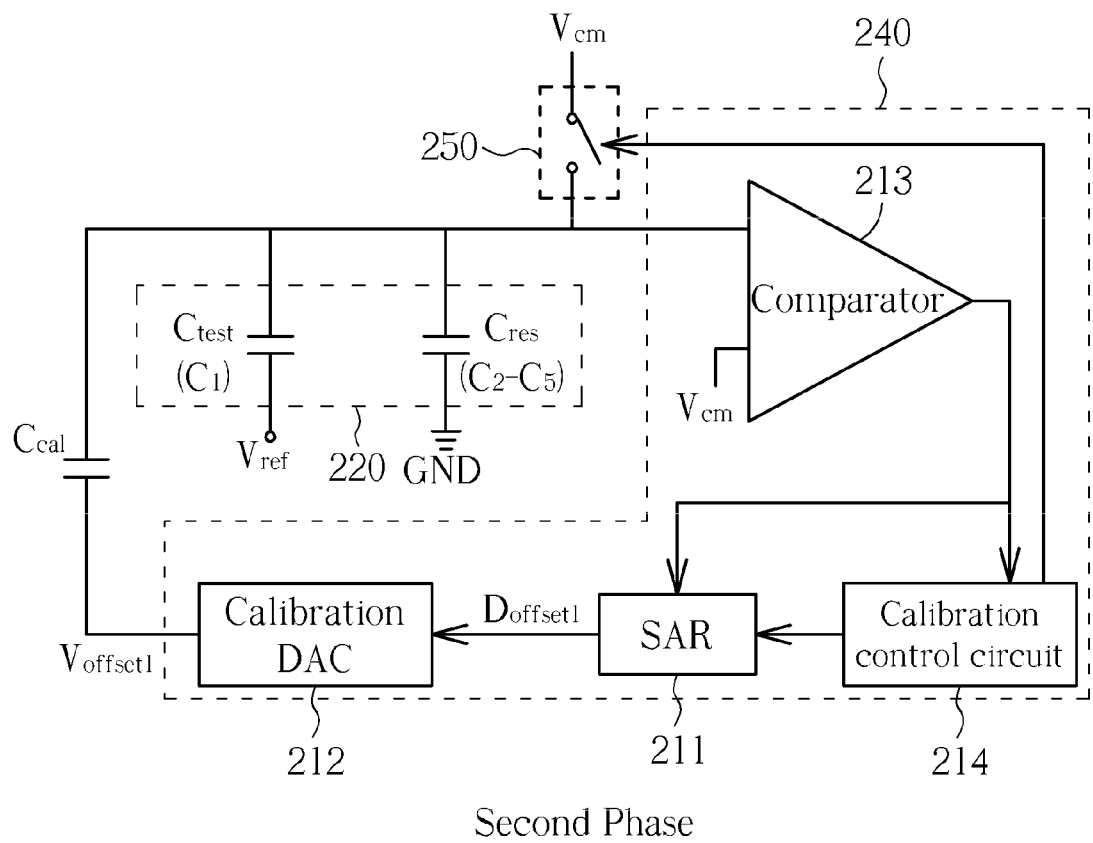
Figure 4C:
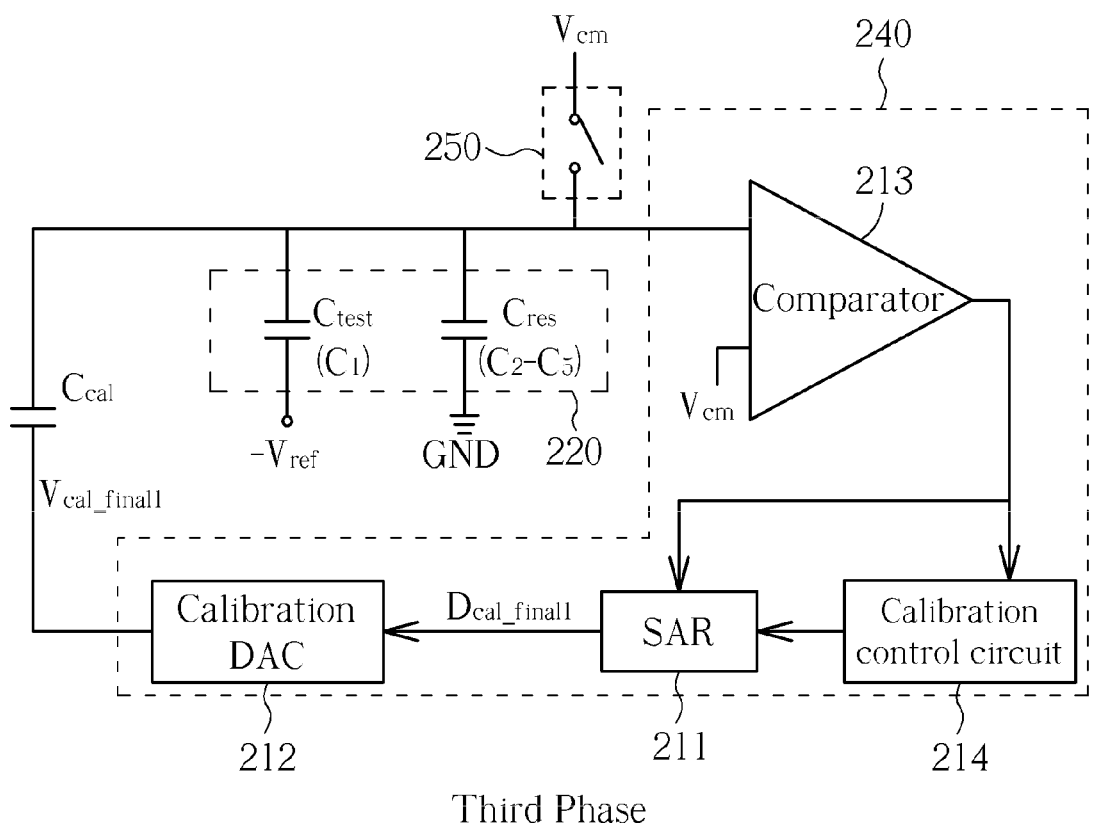

The corresponding first mismatch determination operation is illustrated in FIGS. 4A, 4B and 4C. As shown in FIGS. 4A, 4B and 4C, the capacitor component $C_1$ having the smallest capacitance value is selected as the capacitor component $C_{test}$ to be tested in the first mismatch determination operation, while the combination of remaining capacitor components $C_2$-$C_5$ acts as the capacitor component $C_{res}$. In the first phase of the first mismatch determination operation as shown in FIG. 4A, an offset voltage value of the comparator 213 and a digital code corresponding to the offset voltage will be determined by firstly applying both input terminals of the comparator 213 to the same predetermined voltage $V_{cm}$, for example, 0V. In addition, in this first phase, the calibration control circuit 214 initializes the SAR 211 to output a digital code with an initial value (e.g., 0) into the calibration DAC 213 to make the voltage on the second node of the calibration capacitor component $C_{cal}$ be 0V initially, the second node of the capacitor component $C_{test}$ (e.g., the capacitor component $C_1$) is supplied with a reference voltage $V_{ref}$, and the second nodes of the capacitor components $C_2$-$C_5$ are coupled to ground GND. Then, since there is an inherent offset existing inside the comparator 213, the comparator 213 will wrongly indicate that the voltage levels at its two input terminals supplied with the same predetermined voltage $V_{cm}$ are not the same, and a comparison result will therefore be output to indicate this condition. According to the comparison result, the calibration control circuit 214 controls the SAR 211 and the calibration DAC 212 to tune a test voltage supplied to the second node of the calibration capacitor component $C_{cal}$. Depending on the inherent offset of the comparator 213, the test voltage could be higher than or lower than the initial voltage, say, 0V. As a result, the voltage level on the first nodes of the capacitor components $C_1$-$C_5$, now represented by capacitor components $C_{ref}$ and $C_{res}$, will finally make the comparator 213 generate a comparison result indicating that the voltage levels at its two input terminals are the same. At this time, however, the voltages on the two input terminals could be different. For example, one input terminal of the comparator 213 has a fixed voltage $V_{cm}$ originally applied thereto, whereas the other input terminal of the comparator 213 has an adjusted voltage $V_{cm} \pm \Delta$.

The combination of the comparator 213, the SAR 211, the calibration DAC 212, and the calibration control circuit 214 is substantially equivalent to another ADC 240 different from an SAR ADC composed of the capacitor array 220, the comparator 213, and the SAR 211. In the process of making the comparator 213 with an inherent offset voltage deem that voltage levels at its two input terminals are the same, the ADC 240 finally generates a digital code $D_{offset1}$ corresponding to an input offset voltage $V_{offset1}$ supplied to the calibration capacitor component $C_{cal}$. Once the required digital code $D_{offset1}$ is generated, the first phase of the mismatch determination operation is complete, and the mismatch determination operation then proceeds with the following second phase as shown in FIG. 4B. It should be noted that the ADC 240 operates according to an SAR algorithm which is readily appreciated by those skilled in the art, so the detailed descriptions about how to derive the digital code $D_{offset1}$ are omitted here for the sake of brevity.

In the second phase, the SAR 211 outputs the digital code $D_{offset1}$ to the calibration DAC 212 to thereby generate the offset voltage $V_{offset1}$ to be supplied to the second node of the calibration capacitor component $C_{cal}$. At the same time, one of the input terminals of the comparator 213 is no longer supplied with the voltage $V_{cm}$; instead, it is solely coupled to the first nodes of capacitor components $C_1$-$C_5$ in the capacitor array 220 by the control of the calibration control circuit 214 which switches off the switch unit 250. In addition, with the second node of the capacitor component $C_{test}$ (namely, the capacitor component $C_1$) still coupled to the reference voltage $V_{ref}$, a certain amount of charges are stored within the capacitor array 220 and the calibration capacitor component $C_{cal}$.

Next, the first mismatch determination operation proceeds with a following third phase as shown in FIG. 4C. In the third phase, the second node of the capacitor component $C_{test}$ (namely, the capacitor component $C_1$) is currently coupled to another reference voltage $-V_{ref}$ due to the control applied to the switch circuit 230 (not shown in FIG. 4) by the calibration control circuit 214. Since the voltage coupled to the capacitor component $C_1$ changes, the charges stored therein will also be redistributed. Hence, a certain amount of error charges will appear on the first nodes of the capacitor components $C_1$-$C_5$, which causes an error voltage $V_{err1}$ at the first node of the capacitor component $C_{test}$ (i.e., the capacitor component $C_1$). This error voltage $V_{err1}$ can be further utilized to determine a capacitance difference between $C_1$ and $C_{cal}$, so using the known capacitance value of the calibration capacitor component $C_{cal}$ can obtain the actual capacitance value of the capacitor component $C_1$. As a result, the mismatch between the actual and ideal capacitance value of capacitor component $C_1$ can be determined.

Thus, for the purpose of obtaining the error voltage $V_{err1}$, the digital code $D_{offset1}$ generated during the first phase and a digital code $D_{cal\_final1}$ generated by the ADC 240 after the second node of the capacitor component $C_1$ is supplied with the voltage $-V_{ref}$ should be employed during the third phase. Similar to the operation of obtaining the $D_{offset1}$ mentioned above, the ADC 240 continues to tune another test voltage supplied to the second node of the calibration capacitor component $C_{cal}$ until the comparator 213 deems that the voltage level at the first nodes of the capacitor components $C_1$-$C_5$ is substantially equal to the voltage $V_{cm}$. While the operation finishes, the digital code stored in the SAR 211 is the $D_{cal\_final1}$. Through the calibration DAC 212, another test voltage supplied to the second node of the calibration capacitor component $C_{cal}$ is a corresponding voltage $V_{cal\_final1}$.

Because the error voltage $V_{err1}$ can be determined by subtracting the voltage $V_{offset1}$ from the voltage $V_{cal\_final1}$, the digital code $D_{offset1}$ finally obtained in the first phase is subtracted from the digital code $D_{cal\_final1}$ finally obtained in the third phase. As a result, a digital code $D_{cal1}$ corresponding to the error voltage $V_{err1}$ is obtained, where $D_{cal1}=D_{cal\_final1}-D_{offset1}$. Once the $D_{cal1}$ which acts as a capacitance indication value corresponding to the capacitor component $C_{test}$ (i.e., the capacitor component $C_1$) is obtained, it can be utilized with the predefined capacitance value of the calibration capacitor component $C_{cal}$ to determine the actual capacitance value of the capacitor component $C_1$.

After the three phases of the first mismatch determination operation are accomplished, the exemplary calibration operation of the present invention proceeds with following mismatch determination operations for un-tested capacitor components, which differs slightly from the first one. In the following mismatch determination operations, the component capacitor $C_1$ is known as a tested capacitor component and may be utilized as a reference capacitor component $C_{ref}$ in a second mismatch determination operation; also, each un-tested capacitor component will be respectively selected as a capacitor component under test $C_{test}$ in each following mismatch determination operation until all capacitor components $C_1$-$C_5$ included in the capacitor array 220 have been tested. Simultaneously, as mentioned above, a capacitor component under test $C_{test}$ in the current mismatch determination operation may be incorporated into a reference capacitor component $C_{ref}$ for the following mismatch determination operation.

Please refer to FIGS. 3A, 3B and 3C again. FIGS. 3A, 3B and 3C illustrate one of these mismatch determination operations which are different from the first mismatch determination operation shown in FIG. 4. As can be seen from FIG. 3A, in the first phase, a second node of a reference capacitor component $C_{ref}$ (namely the capacitor component $C_1$) is coupled to the voltage $V_{ref}$ while a capacitor component under test $C_{test}$ (namely the capacitor component $C_2$) has a second node coupled to the ground GND and the remaining capacitor component $C_{res}$ including capacitor components $C_3$, $C_4$, and $C_5$ have their second nodes also coupled to the ground GND. In addition, the calibration control circuit 214 initializes the SAR 211 to output a digital code with an initial value (e.g., 0) to the calibration DAC 212 to make the voltage at the second node of the calibration capacitor component $C_{cal}$ reset to 0V initially, and both input terminals IN1, IN2 of the comparator 213 are supplied with the same predetermined voltage $V_{cm}$ (e.g., 0V). As a result, an input offset voltage $V_{offset2}$ and a corresponding digital code $D_{offset2}$ can thereby be determined. Specifically, the calibration control circuit controls the SAR 211 and the calibration DAC 212 to tune a test voltage to be supplied to the second node of the calibration capacitor component $C_{cal}$; then, the voltage level on the first nodes of the capacitor components $C_1$-$C_5$ will finally make the comparator 213 generate a comparison result indicating that the voltage levels presented at its two input terminals IN1, IN2 are the same.

In the second phase as shown in FIG. 3B, the SAR 211 outputs the digital code $D_{offset2}$ to the calibration DAC 212 to thereby make the input offset voltage $V_{offset2}$ applied to the second node of the calibration capacitor component $C_{cal}$. At the same time, the first input terminal IN1 of the comparator 213 is no longer supplied with the voltage $V_{cm}$ due to the switch unit 250 being switched off by the calibration control circuit 214; instead, it is solely coupled to the first nodes of capacitors $C_1$-$C_5$ included in the capacitor array 220. In addition, with the second node of the reference capacitor component $C_{ref}$ (i.e., the capacitor component $C_1$) and the capacitor component under test $C_{test}$ (i.e., the capacitor component $C_2$) still respectively coupled to the reference voltage $V_{ref}$ and ground GND, a certain amount of charges are thereby stored within the capacitor array 220 and the calibration capacitor component $C_{cal}$.

Next, the second mismatch determination operation proceeds with the following third phase, as shown in FIG. 3C. In the third phase, the voltage level applied to the second nodes of the capacitor components $C_{ref}$ and $C_{test}$ (i.e., the capacitor components $C_1$ and $C_2$) are interchanged due to the control of the switch circuit 230 by the calibration control circuit 214. Since the voltage levels coupled to the capacitor components $C_1$ and $C_2$ are interchanged, the charges stored therein will also be redistributed. Hence, a certain amount of error charges will appear on the first nodes of the capacitor components $C_1$-$C_5$, which causes an error voltage $V_{err2}$ on the first nodes of capacitor components $C_1$-$C_5$. This error voltage $V_{err2}$ and the capacitance value of the calibration capacitor component $C_1$ can be further utilized to obtain the actual capacitance value of the capacitor component $C_2$ so as to determine the mismatch between the actual and ideal capacitance value of capacitor component $C_2$. Thus, for the purpose of determining the error voltage $V_{err2}$, the digital code $D_{offset2}$ generated during the first phase and a digital code $D_{cal\_final2}$ generated by the ADC 240 after the voltage levels of the second nodes of the capacitor components $C_{ref}$ and $C_{test}$ (i.e., the capacitor components $C_1$ and $C_2$) are interchanged should be employed in the third phase. Therefore, the ADC 240 continues to tune the test voltage supplied to the second node of the calibration capacitor component $C_{cal}$ until the comparator 213 deems that the voltage level at the first nodes of the capacitor components $C_1$-$C_5$ is substantially equal to the predetermined voltage $V_{cm}$. While this operation finishes, the digital code stored in the SAR 211 is $D_{cal\_final2}$. Through the calibration DAC 212, the test voltage supplied to the second node of the calibration capacitor component is a corresponding voltage $V_{cal\_final2}$.

Because the error voltage $V_{err2}$ can be determined by subtracting the voltage $V_{offset2}$ from the voltage $V_{cal\_final2}$, the digital code $D_{offset2}$ finally obtained in the first phase is subtracted from the digital code $D_{cal\_final2}$ finally obtained in the third phase. As a result, a digital code $D_{cal2}$ corresponding to the error voltage $V_{err2}$ is obtained, where $D_{cal2}=D_{cal\_final2}-D_{offset2}$. Once the desired digital code $D_{cal2}$ which acts as a capacitance indication value corresponding to the capacitor component $C_2$ is obtained, it can be utilized with the capacitance value of the reference capacitor component $C_{ref}$ (i.e., the capacitor component $C_1$) determined in the preceding mismatch determination operation (i.e., the first mismatch determination operation) to determine the actual capacitance of the capacitor component $C_2$.

Figure 5A:
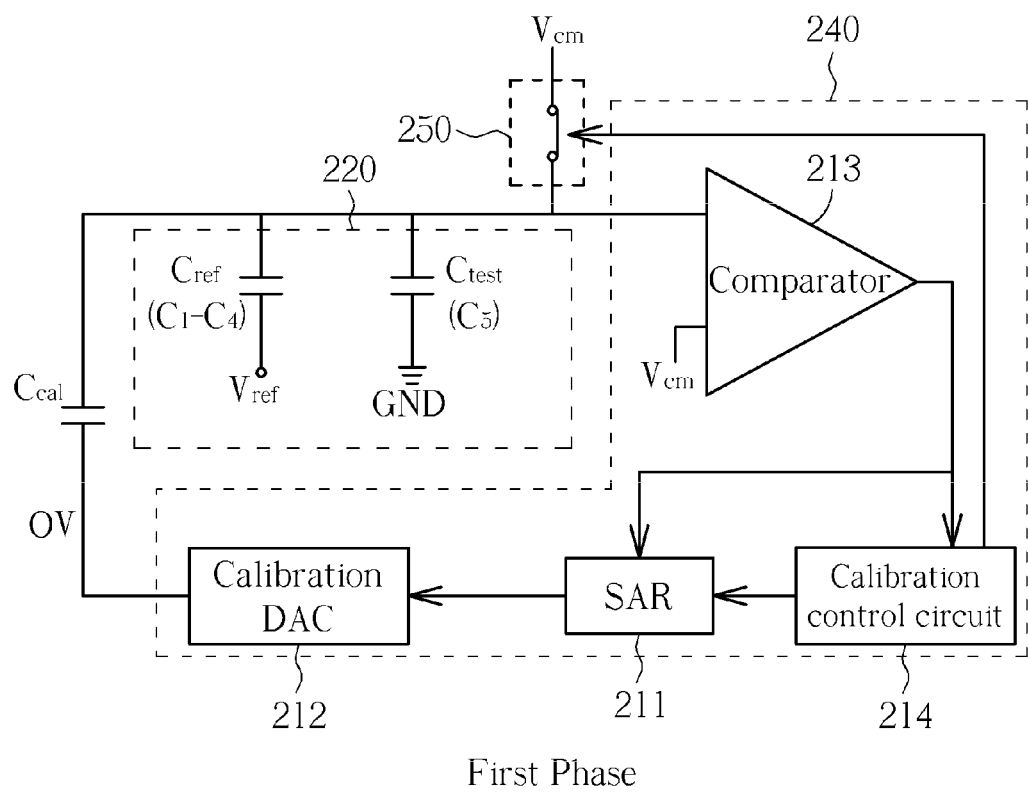
FIG. 5A-5C are simplified diagrams respectively showing a first, second and third phases of a calibration operation according to yet another exemplary embodiment of the present invention.
Figure 5B:
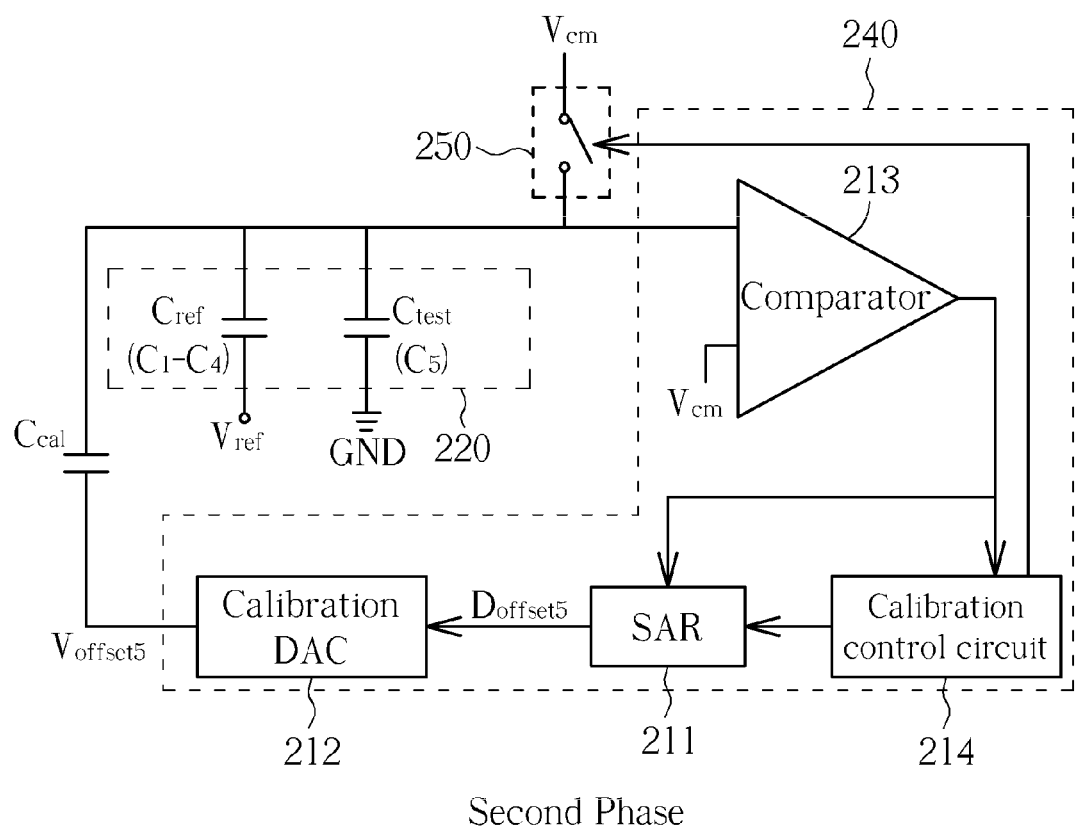
Figure 5C:
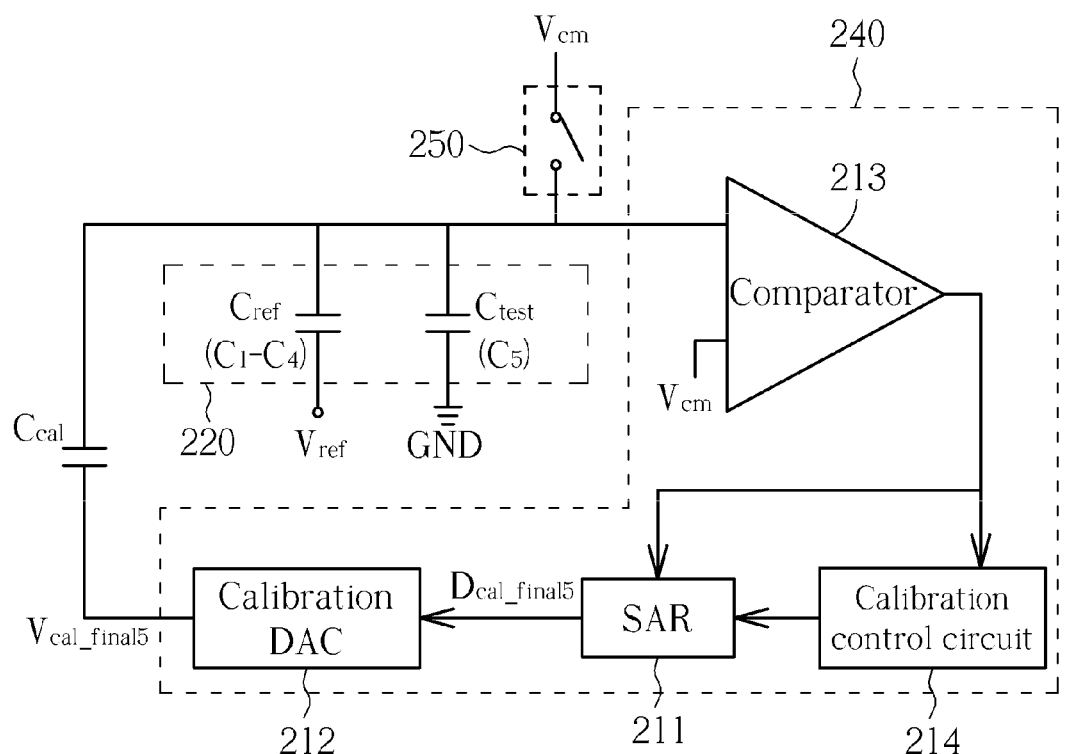

FIGS. 5A, 5B and 5C are simplified diagrams showing a specific mismatch determination operation according to yet another exemplary embodiment of the present invention. As shown in FIGS. 5A, 5B and 5C, when the mismatch determination operation is executed for the last time (i.e., only one capacitor component in the capacitor array 220 remains untested), there is only a capacitor component $C_{test}$ (for example, the capacitor component $C_5$ with the largest capacitance value) and a capacitor component $C_{ref}$ (for example, the capacitor component $C_{ref}$ is equivalent to a parallel connection of the tested capacitor components $C_1$-$C_4$). As the operation for deriving a capacitance indication value corresponding to the capacitor component $C_{test}$ (i.e., the capacitor component $C_5$) is identical to that for deriving the capacitance indication value corresponding to the capacitor component $C_2$ as mentioned above, further description is omitted here for brevity.

After all the mismatch determination operations are performed, the calibration control circuit 214 included in the calibration circuit 210 determines capacitance weighting values of the capacitor components $C_1$-$C_5$ included in the capacitor array 220 according to capacitance indication values of the capacitor components $C_1$-$C_5$, and the digital output of the SAR ADC is calibrated according to at least one of the capacitance weighting values calculated by the calibration control circuit 214. For example, assume the capacitance indication values of the capacitor components $C_1$-$C_5$ are denoted by $V_1$-$V_5$, respectively, and the capacitance weighting values $W_1$-$W_5$ of the capacitor components $C_1$-$C_5$ are $V_1$, $V_1+V_2$, $V_1+V_2+V_3$, $V_1+V_2+V_3+V_4$ and $V_1+V_2+V_3+V_4+V_5$, respectively. Thus, the code correction operation can be performed for each A/D conversion of the SAR ADC. Assuming that the ideal capacitance weighting values of capacitor components $C_1$, $C_2$, $C_3$, $C_4$ and $C_5$ of the capacitor array 220 are designed to respectively be 1, 2, 4, 8, and 16 while imperfect of fabrication causes the actual capacitance weighting values $W_1$-$W_5$ to be 1, 1.8, 4.1, 7.9 and 16 according to the mismatch determination operations performed previously, these differences between the ideal values and the actual values can be used to calibrate these capacitance mismatches. However, one exemplary implementation of the present invention does not directly calibrate the capacitor array 220, but calibrates the digital output generated by the normal conversion of the SAR ADC, instead. For example, in a specific A/D conversion of the SAR ADC, the capacitor components $C_1$, $C_3$ and $C_5$ are known to be related to a digital output $D_{out}$ of this A/D conversion, so the code correction operation can be performed in the digital domain to correct the error digital output $D_{out}$ (due to capacitance mismatch) according to the relative capacitor components $C_1$, $C_3$ and $C_5$ and their corresponding actual weighting values $W_1$, $W_3$, $W_5$ (e.g., 1, 4.1 and 16). In the code correction operation, the digital output is directly adjusted by subtracting a certain digital code or adding a certain digital code according to a specific algorithm.

Figure 6:
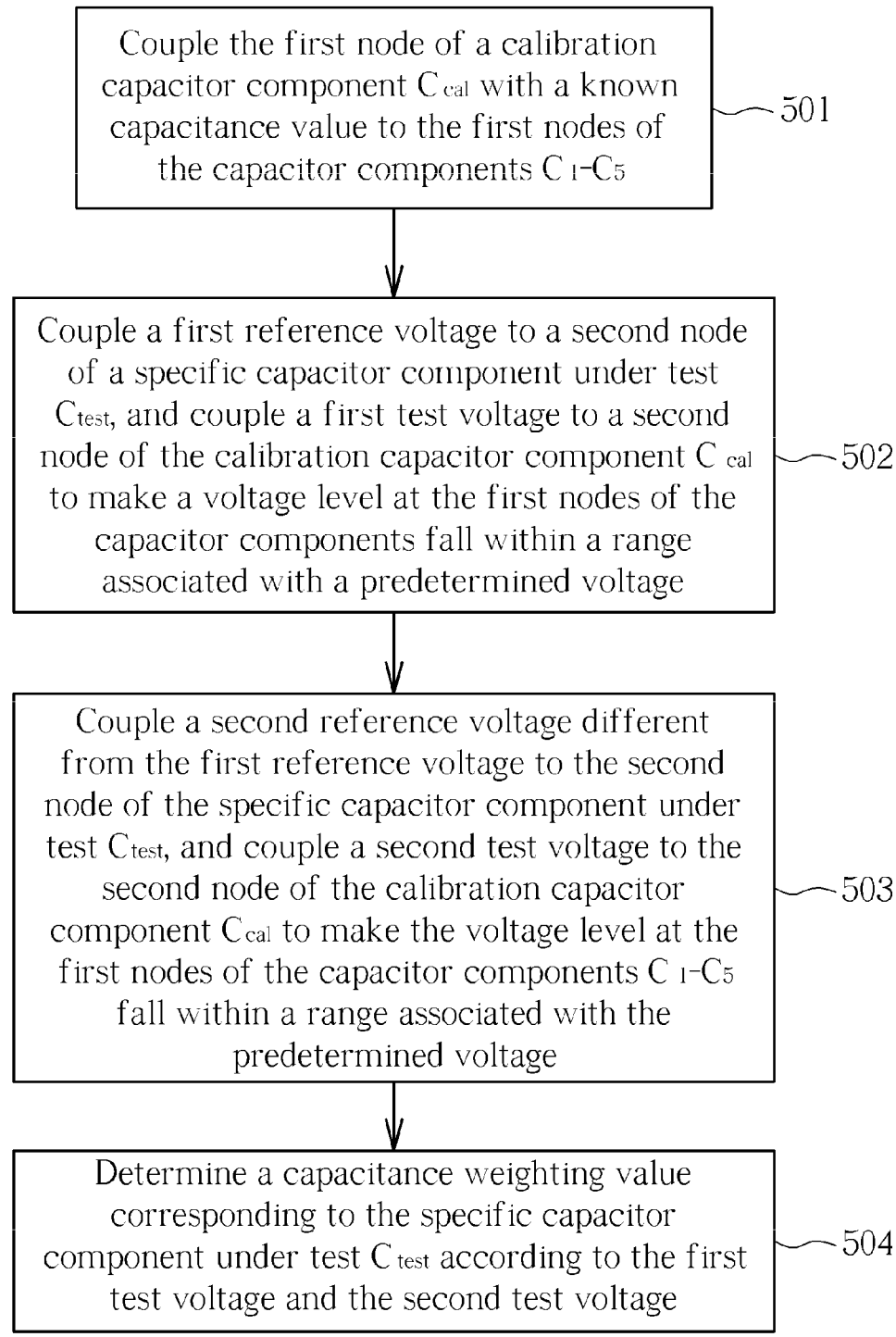
FIG. 6 is a flowchart of a calibration method according to one exemplary embodiment of the present invention.

According to one exemplary embodiment of the present invention, the calibration method of the present invention can be briefly summarized as illustrated in FIG. 6, and steps of the calibration method will be explained in conjunction with the above-mentioned embodiment:

STEP 501: Couple the first node of a calibration capacitor component $C_{cal}$ with a known capacitance value to the first nodes of the capacitor components $C_1$-$C_5$; please note that the capacitance value of the calibration capacitor component $C_{cal}$ is not necessary to be precisely known (i.e. not necessary to have zero mismatch between ideal and actual capacitance values) since the calibration capacitor component $C_{cal}$ is used as a calibration base. The linearity of the ADC after calibration still can be improved even the calibration capacitor component $C_{cal}$ is not precise.

STEP 502: Couple a first reference voltage to a second node of a specific capacitor component under test $C_{test}$, and couple a first test voltage to a second node of the calibration capacitor component $C_{cal}$ to make a voltage level at the first nodes of the capacitor components fall within a range associated with a predetermined voltage;

STEP 503: Couple a second reference voltage different from the first reference voltage to the second node of the specific capacitor component under test $C_{test}$, and couple a second test voltage to the second node of the calibration capacitor component $C_{cal}$ to make the voltage level at the first nodes of the capacitor components $C_1$-$C_5$ fall within a range associated with the predetermined voltage;

STEP 504: Determine a capacitance weighting value corresponding to the specific capacitor component under test $C_{test}$ according to the first test voltage and the second test voltage.

In STEP 501, a first node of a calibration capacitor component is coupled with a known capacitance value (which is predefined in the design of the calibration apparatus 210) to the first nodes of the capacitor components $C_1$-$C_5$. Then, as performed in the second phase of the mismatch determination operation in FIGS. 3A, 3B and 3C and FIGS. 4A, 4B and 4C, a first reference voltage (which is $V_{ref}$ in the case of FIG. 4 or GND in the case of FIG. 3) is coupled to a second node of a specific capacitor component under test $C_{test}$ (which is $C_1$ in the case of FIG. 4A-4C or $C_2$ in the case of FIG. 3A-3C), and a first test voltage (which is $V_{offset1}$ in FIG. 4A-4C or $V_{offset2}$ in FIG. 3A-3C) is coupled to a second node of the calibration capacitor component $C_{cal}$ to make a voltage level at the first nodes of the capacitor components $C_1$-$C_5$ fall within a range (due to the offset of the comparator) associated with a predetermined voltage in STEP 502. Accordingly, the exemplary flow proceeds with STEP 503, where a second reference voltage (which is $-V_{ref}$ in the case of FIG. 4A-4C or GND in the case of FIG. 3A-3C) different from the first reference voltage is coupled to the second node of the specific capacitor component under $C_{test}$, and a second test voltage is supplied to the second node of the calibration capacitor component $C_{cal}$ to make the voltage level at the first nodes of the capacitor components $C_1$-$C_5$ fall within a range associated with the predetermined voltage. Finally, in STEP 504, a capacitance weighting value corresponding to the specific capacitor component under test $C_{test}$ according to the aforementioned first test voltage and the second test voltage is determined.

Furthermore, in the exemplary embodiment of the present invention, the comparator 213 is utilized to compare the voltage level at the first nodes of the capacitor components with the predetermined voltage to generate a comparison result. Accordingly, the SAR 211 and the calibration DAC 212 tunes a test voltage supplied to the second node of the calibration capacitor component $C_{cal}$ according to the first comparison result until the voltage level at the first nodes of the capacitor components $C_1$-$C_5$ falls within a range associated with the predetermined voltage adjusts a digital value according to the comparison result by the SAR 211, and performs a digital-to-analog conversion upon the digital value to generate the test voltage supplied to the second node of the calibration capacitor component $C_{cal}$ by the calibration DAC 212. Furthermore, STEP 504 also refers to digital values respectively corresponding to the first test voltage and the second test voltage to determine the desired capacitance weighting value corresponding to the specific capacitor component under $C_{test}$, wherein the digital values are digital codes generated in the first phase and the third phase of the mismatch determination operation.

As the calibration method of the present invention operates independently to a normal operation of the ADC application (e.g., an SAR ADC), the ADC application can operate at a higher sampling rate due to fewer redundant circuits. Also, the present invention uses a relatively simple calculation to complete the calibration process, including the mismatch determination operation and the code correction operation, so less cost as well as power consumption is required. Also, this calibration computation can be completed not only in the hardware-domain, but also in the software-domain. Therefore, the exemplary calibration method and apparatus of the present invention are very suitable for an embedded system.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter is not limited to the specific features or acts described. Rather, the specific features and acts are disclosed as sample forms of implementing the claimed subject matter.

Those skilled in the art will readily observe that numerous modifications and alterations of the device and method may be made while retaining the teachings of the invention.

What is claimed is:

1. A calibration method for a capacitor array including a plurality of capacitor components each having a first node and a second node, first nodes of the capacitor components being coupled to each other, the calibration method comprising:
   coupling a first node of a calibration capacitor component with a known capacitance value to the first nodes of the capacitor components;
   coupling a first reference voltage to a second node of a specific capacitor component under test selected from the plurality of capacitor components, comparing the voltage level at the first nodes of the capacitor components with a predetermined voltage to generate a first comparison result and tuning a first test voltage supplied to the second node of the calibration capacitor component according to the first comparison result until the first comparison result indicates that the voltage level at the first nodes of the capacitor components is substantially equal to the predetermined voltage;
   coupling a second reference voltage different from the first reference voltage to the second node of the specific capacitor component under test, comparing the voltage level at the first nodes of the capacitor components with the predetermined voltage to generate a second comparison result and tuning a second test voltage supplied to the second node of the calibration capacitor component according to the second comparison result until the second comparison result indicates that the voltage level at the first nodes of the capacitor components is substantially equal to the predetermined voltage; and
   determining a capacitance indication value corresponding to the specific capacitor component under test according to the first test voltage and the second test voltage.

2. The calibration method of claim 1, wherein the capacitor components include the specific capacitor component under test and at least one un-tested capacitor component; a second node of the at least one un-tested capacitor component is coupled to the same voltage no matter whether the second node of the specific capacitor component under test is coupled to the first reference voltage or the second reference voltage.

3. The calibration method of claim 1, wherein the capacitor components include the specific capacitor component under test, at least one tested capacitor component, and at least one un-tested capacitor component; a second node of the at least one un-tested capacitor component is coupled to the same voltage no matter whether the second node of the specific capacitor component under test is coupled to the first reference voltage or the second reference voltage; a second node of the at least one tested capacitor component is coupled to the second reference voltage when the second node of the specific capacitor component under test is coupled to the first reference voltage; and the second node of the at least one tested capacitor component is coupled to the first reference voltage when the second node of the specific capacitor component under test is coupled to the second reference voltage.

4. The calibration method of claim 3, wherein a total capacitance value of the at least one tested capacitor component is not greater than a capacitance value of the specific capacitor component.

5. The calibration method of claim 1, wherein the capacitor components include the specific capacitor component under test and at least one tested capacitor component; a second node of the at least one tested capacitor component is coupled to the second reference voltage when the second node of the specific capacitor component under test is coupled to the first reference voltage; and the second node with at least one tested capacitor component is coupled to the first reference voltage when the second node of the specific capacitor component under test is coupled to the second reference voltage.

6. The calibration method of claim 5, wherein a total capacitance value of the at least one tested capacitor component is not greater than a capacitance value of the specific capacitor component.

7. The calibration method of claim 1, wherein the capacitance indication value indicates an error of the specific capacitor component under test.

8. The calibration method of claim 1, wherein the step of tuning the test voltage supplied to the second node of the calibration capacitor component according to the comparison result comprises:
- adjusting a digital value according to the comparison result; and
- performing a digital-to-analog conversion upon the digital value to generate the test voltage supplied to the second node of the calibration capacitor component.

9. The calibration method of claim 8, wherein the step of determining the capacitance indication value corresponding to the specific capacitor component under test comprises:
- referring to digital values respectively corresponding to the first test voltage and the second test voltage to determine the capacitance indication value corresponding to the specific capacitor component under test.

10. The calibration method of claim 9, wherein the capacitance indication value corresponding to the specific capacitor component under test is determined according to a difference between the digital values respectively corresponding to the first test voltage and the second test voltage.

11. The calibration method of claim 1, wherein the capacitor array is implemented in an application which generates a digital output, and the calibration method further comprises:
- determining capacitance weighting values of the capacitor components included in the capacitor array according to capacitance indication values of the capacitor components; and
- calibrating the digital output according to at least one of the capacitance weighting values.

12. A calibration apparatus for a capacitor array including a plurality of capacitor components each having a first node and a second node and a switch circuit, first nodes of the capacitor components being coupled to each other, the switch circuit being coupled between the second nodes of the capacitor components and a plurality of different predetermined voltages, the calibration apparatus comprising:
- a calibration capacitor component, having a first node coupled to the first nodes of the capacitor components of the capacitor array and a second node; and
- a calibration circuit, coupled to the second node of the calibration capacitor component, the switch circuit, and the first nodes of the capacitor components, the calibration circuit configured for:
  - controlling the switch circuit to couple a first reference voltage to a second node of a specific capacitor component under test selected from the plurality of capacitor components, and coupling a first test voltage to the second node of the calibration capacitor component to make a voltage level at the first nodes of the capacitor components fall within a range associated with a predetermined voltage;
  - controlling the switch circuit to couple a second reference voltage different from the first reference voltage to the second node of the specific capacitor component under test, and coupling a second test voltage to the second node of the calibration capacitor component to make the voltage level at the first nodes of the capacitor components fall within a range associated with the predetermined voltage; and
  - determining a capacitance indication value corresponding to the specific capacitor component under test according to the first test voltage and the second test voltage;

wherein the calibration circuit comprises:
- a comparator, having a first input terminal coupled to the first nodes of the capacitor components included in the capacitor array and a second input terminal coupled to the predetermined voltage, for comparing the voltage level at the first nodes of the capacitor components with the predetermined voltage to generate a comparison result; and
- a voltage adjuster, coupled between an output terminal of the comparator and the second node of the calibration capacitor component, for tuning a test voltage supplied to the second node of the calibration capacitor component according to the comparison result until the comparison result indicates that the voltage level at the first nodes of the capacitor components is substantially equal to the predetermined voltage, thereby coupling the first test voltage to the second node of the calibration capacitor component when the switch circuit couples the first reference voltage to the second node of the specific capacitor component under test, and coupling the second test voltage to the second node of the calibration capacitor component when the switch circuit couples the second reference voltage to the second node of the specific capacitor component under test.

13. The calibration apparatus of claim 12, wherein the capacitor array is implemented in an application which generates a digital output, and the calibration circuit further determines capacitance weighting values of the capacitor components included in the capacitor array according to capacitance indication values of the capacitor components, and the digital output is calibrated according to at least one of the capacitance weighting values.

14. The calibration apparatus of claim 12, wherein the calibration circuit further comprises:
- a switch unit, coupled between the predetermined voltage and the first input terminal of the comparator; and
- a calibration control circuit, coupled to the switch circuit of the capacitor array and the switch unit, for controlling operations of the switch circuit of the capacitor array and the switch unit.

15. The calibration apparatus of claim 12, wherein the voltage adjuster comprises:
- a successive approximation register, coupled to the output terminal of the comparator, for generating a digital value according to the comparison result; and
- a calibration digital-to-analog converter (DAC), coupled to the successive approximation register and the second node of the calibration capacitor component, for outputting the test voltage to the second node of the calibration capacitor component according to the digital value.

16. The calibration apparatus of claim 15, wherein the calibration circuit further comprises:
- a calibration control circuit, coupled to the successive approximation register, for referring to digital values respectively corresponding to the first test voltage and the second test voltage to determine the capacitance indication value corresponding to the specific capacitor component under test.

17. The calibration apparatus of claim 16, wherein the capacitance indication value corresponding to the specific capacitor component under test is equal to a difference between the digital values respectively corresponding to the first test voltage and the second test voltage.

* * * * *